United States Patent [19]

Blaum et al.

[11] Patent Number: 5,068,858
[45] Date of Patent: Nov. 26, 1991

[54] ERROR CORRECTION CAPABILITY VARIED WITH TRACK LOCATION ON A MAGNETIC OR OPTICAL DISK

[75] Inventors: Miguel M. Blaum, San Jose; Hsieh T. Hao, Los Altos, both of Calif.

[73] Assignee: International Business Machines Corporation, Armonk, N.Y.

[21] Appl. No.: 455,197

[22] Filed: Dec. 21, 1989

[51] Int. Cl.$^5$ ............................................. G06F 11/10
[52] U.S. Cl. ..................................... 371/41; 371/40.1
[58] Field of Search ................ 371/41, 40.1, 2.1, 2.2; 360/48, 53

[56] References Cited

U.S. PATENT DOCUMENTS

| 3,078,443 | 2/1963 | Rose | 371/41 |
| 3,668,631 | 6/1972 | Griffith | 371/41 |
| 4,047,151 | 9/1977 | Rydbeck | 371/41 |
| 4,788,685 | 11/1988 | Sako | 371/41 X |
| 4,804,959 | 2/1989 | Makansi et al. | 341/59 |
| 4,975,915 | 12/1990 | Sako | 371/41 X |

OTHER PUBLICATIONS

Bate et al., "Error Control Techniques Applicable to HF Channels", *IEE Proceedings*, vol. 136, Pt. 1, No. 1, Feb. 1989, pp. 57–63.
Dave Bursky, "Optical Drives Give Designers 3.5- or 5.25-in. Disk Formats", *Electronic Design*, May 26, 1988, pp. 57–60.
Mark S. Young, "Constant-Density Recording Comes Alive with New Chips", *Electronic Design*, Nov. 13, 1986, pp. 141–144.

*Primary Examiner*—Robert W. Beausoliel
*Attorney, Agent, or Firm*—Henry E. Otto, Jr.

[57] ABSTRACT

A method for implementing error-correcting codes for disks, wherein the statistics of error vary according to the radius of the location being accessed.

A Reed-Solomon code is selected having data bytes and redundant bytes and an error-correcting capability sufficient to protect against an anticipated worst case or errors.

The number of redundant bytes in that code, and thereby the number of correctable errors, is progressively reduced in respective concentric areas of the disk according to the statistics of error for such areas, for thereby progressively reducing the number of correctable errors as the need for error correction capability decreases.

For multiband recording, the areas are concentric bands in each of which data is recorded at a clock frequency substantially proportional to its inner diameter; and in such case, the number of redundant bytes is reduced progressively in each successive band toward the innermost band.

For conventional recording, the areas are concentric tracks recorded at substantially the same frequency; and in such case, the number of redundant bytes is reduced toward the outermost concentric area.

This method may also be used to increase correction capability periodically when capability decreases, due for example to corrosion of a write-once optical disk.

13 Claims, 1 Drawing Sheet

ERROR CORRECTION CAPABILITY VARIED WITH TRACK LOCATION ON A MAGNETIC OR OPTICAL DISK

This invention relates to a method for correcting errors in magnetic or optical disks, and more particularly to such a method wherein the error correction capability is progressively changed in successive bands or tracks toward the innermost band or track of a multiband or conventional disk, respectively.

BACKGROUND OF THE INVENTION

Data stored in magnetic or optical disks are usually protected by so-called Reed-Solomon (RS) codes. Whenever the redundancy of a RS code is 2t bytes, the code can correct up to s bytes in error and e erased bytes, where $2s+e \leq 2t$. It will be assumed that a byte consists of 8 bits; hence RS codes over GF(256) will be considered.

Normally, the user data are divided into sectors, each consisting of 512 user bytes. Since noise in the channel affects recovery of these user bytes, redundancy is added to them using a RS code. A common strategy is to divide a sector into eight strings of information bytes, each string having 64 bytes, and to encode each string; then the eight strings are interleaved, providing protection against bursts.

From the foregoing, it will be noted that a crucial parameter for the ECC to protect the disk is the error-correcting capability t of the RS code. The choice of t is determined by the statistics of errors in the magnetic or optical recording channel. In general, t is chosen in such a way that it provides adequate protection against a worst case of errors in normal operating conditions.

New techniques for magnetic and optical recording involve recording in multiple bands; i.e., an inner band (1), a second band (2) and so on, until reaching the outermost band (m). Usually in multiband recording, the clock frequency of each band is designed to be directly proportional to the inner diameter (ID) of that band. As a result, it is clear that higher error rates will occur on the outer bands than on the inner bands. This is basically due to the fact that the signal detection window is narrower on the outer bands, and the fly-height is higher at the outer bands. Therefore, it can be assumed that the statistical errors rates vary and depend on the band being considered, and that more error protection is required to the data in the outer bands than in the inner bands.

The traditional ECC solution would be to implement a RS code whose error correcting capability t can handle errors in the outer band. However, such a procedure is wasteful. Since the inner bands suffer less errors, they do not require so much redundancy. Another solution would be to implement different codes according to the band being accessed, such as described in U.S. Pat. No. 4,804,959 for the (1,7) and (2,7) run-length-limited codes. While this is feasible, it complicates the hardware significantly.

The most pertinent prior art of which applicants are aware is the paper entitled "Error Control Techniques Applicable to HF Channels", published in the IEEE Proceedings, Vol. 136, Pt. 1, No. 1, Feb. 1989 at pp. 57-63. This paper describes a technique that involves puncturing (deleting) RS codes for a high frequency (HF) channel. In that technique a product code is used adaptively as follows: each row and column are decoded independently. However, instead of transmitting the full row (or column), only a word is transmitted in which f symbols have been punctured. The punctured symbols are treated as erasures and assumed to be zero by the receiver, which calculates the modified syndromes. If these modified syndromes are zero, the receiver concludes that no errors have occurred. If some syndromes are not zero, then the sender sends the additional (previously deleted) redundant bytes and correction is attempted. This technique assumes that communication from receiver to sender is possible, and uses punctured words for detection and not for correction.

Articles published in the May 26, 1988 issue of *Electronic Design* at pp. 57-60 and published in the Nov. 13, 1986 issue of *Electronic Design* at pp. 141-144 describe the advantages of constant-density recording for optical and magnetic recording, respectively.

There is a need for an error correction procedure that permits an overall increase in storage capacity by using punctured or deleted bytes and taking advantage of the fact that in magnetic or optical disks the inner bands require different error correction capability than the outer bands. There is also a need for an error correction procedure adapted for use with disk files, where writing and reading of data involve only one-way communication to or from the file, respectively.

SUMMARY OF THE INVENTION

Toward this end and according to the invention, a method is illustrated and described for implementing error-correction codes for disks recorded in multiple concentric bands. A RS code is selected having data bytes and redundant bytes and an error-correcting capability sufficient to protect against an anticipated worst case of errors on the disk. The data bytes and redundant bytes are recorded at each band at a clock frequency proportional to the inner diameter of that respective band. The number of redundant bytes in the code is progressively reduced at each successive band toward the innermost band, thereby progressively reducing the number of correctable errors as statistical error rate reduces toward the center of the disk. This method employs new decoders that have a complexity no greater than that of traditional RS decoders yet provide more error correction in the outer bands and allow significant savings in redundancy in the inner bands.

To avoid confusion, other applications for the invention will be described toward the end of the specification, for it is not limited to use with multiband disks.

DESCRIPTION OF PREFERRED EMBODIMENT

I. Introduction and Theory

Assume initially that a multiband disk has bands denoted 1,2,...,m, starting with innermost band 1. In band 1 we implement a t error-correcting RS code; and in band 2, a t+1 error-correcting code, etc., such that in band m, a t+m−1 error-correcting code is implemented. However, the encoding and decoding circuits of the t+m−1 error-correcting code are used. This is done by exploiting the nested structure of RS codes.

Assuming a conventional disk drive wherein the error-correcting capability of RS codes does not exceed 8 bytes, it is necessary that $1 \leq t$ and $t+m-1 \leq 8$. Assuming now $\alpha$ to be a primitive element in GF(256), then $\alpha$ is a root of the primitive polynomial $p(x) = 1 + x^2 + x^3 + x^4 + x^8$. Let $$g(x) = \prod_{l=1}^{2(t+m-1)} (x + \alpha^l).$$

To encode an information polynomial $a(x) = a_0 + a_1x + \ldots + a_{k-1}x^{k-1}$ in band i, $1 \leq i \leq m$. The encoder proceeds as follows:

1. Determine $$b(x) = \sum_{l=0}^{2(t+m-1)-1} b_l x^l$$

as the result of dividing $x^{2(t+m-1)}a(x)$ by $g(x)$.

2. Let $$b^{(i)}(x) = \left( \sum_{l=2(m-i)}^{2(t+m-1)-1} b_l x^l \right) / x^{2(m-i)}.$$

Encode $a(x)$ as $b^{(i)}(x) + x^{2(t+i-1)}a(x)$.

Note that the encoder uses the same circuits as the encoder of a RS code with generator polynomial $g(x)$. This is the code which would be used with the traditional error correcting approach. Each codeword is divided into two parts: first the redundancy, represented by the polynomial $b^{(i)}(x)$, and then the information part, represented by the polynomial $x^{2(t+i-1)}a(x)$. The redundancy thus depends on the band being accessed: in band i, the codewords carry $2(t+i-1)$ redundant bytes.

To decode, assuming that band i is being accessed and the received polynomial is $$r(x) = \sum_{l=0}^{k+2(t+i-1)} r_l x^l,$$

proceed as follows:

1. Use the polynomial $r^{(i)}(x) = x^{2(m-i)}r(x)$.
2. Apply an error-erasure decoding algorithm to $r^{(i)}(x)$, assuming erasures in bytes $0, 1, \ldots, 2(m-i)-1$.
3. Produce as output the estimate $a(x)$ of the information polynomial $a(x)$.

Thus, the decoder also uses the decoding algorithm of the RS code generated by $g(x)$.

II. Detailed Description

Figure 1:
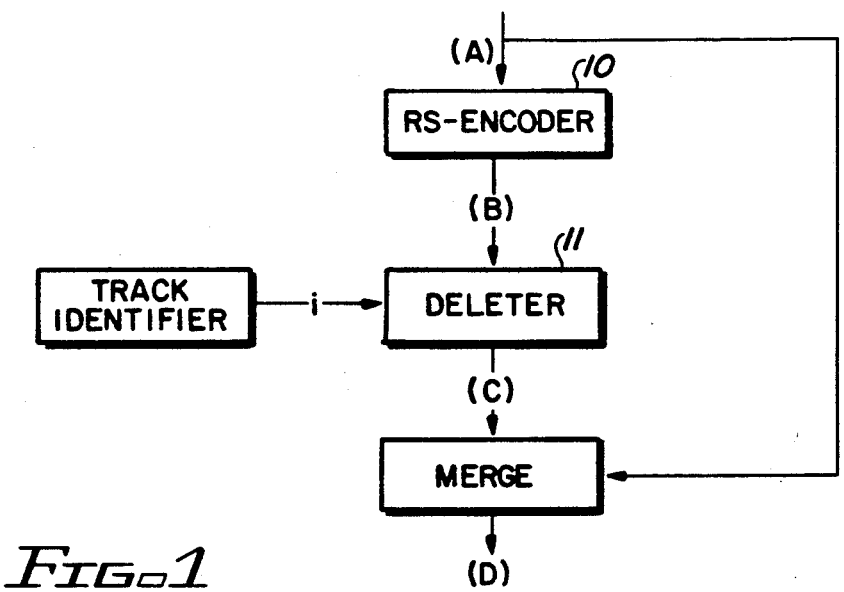
FIG. 1 is a schematic diagram showing the encoding process for implementing the invention.

A.1—Encoding Process—FIG. 1

The input for the encoding process is a string of information bytes $$a_0, a_1, \ldots, a_{k-1} \quad (A)$$

This string is sent to a $[k+2(t+m-1), k]$ RS-encoder 10. Encoder 10 performs the operation described in Section I and produces as output the redundant bytes $$b_0, b_1, \ldots, b_{2(t+m-1)-1} \quad (B)$$

The redundant bytes are transmitted to a deleter 11, which also receives as input from a track identifier 12 the track number i in which the data, $1 \leq i \leq m$, is to be encoded. Deleter 11 discards the first $2(m-i)$ redundant bytes and produces as output the string $$b_{2(m-i)}, b_{2(m-i)+1}, \ldots, b_{2(t+m-1)-1} \quad (C)$$

Finally, the input data string A is merged at 13 with deleter output string C to provide, as the encoder output the string $$b_{2(m-i)}, b_{2(m-i)+1}, \ldots, b_{2(t+m-1)-1}, a_0, a_1, \ldots, a_k \quad (D)$$

A.2—Example Using Encoding Process

For sake of illustration, assume that m, the number of bands $=4$, that t, the error-correcting capability of the code in the innermost band $\mathbf{1} = 3$; and that k, the number of information bytes in each codeword $= 64$ (i.e., there are 4 codewords per sector).

These assumptions imply that a 6-byte correcting RS code must be implemented. So, the generator polynomial, $g(x)$, is $$g(x) = \prod_{l=1}^{12} (x + \alpha^l).$$

The full power of the code, however, is used only in the outermost band 4.

The number of information bytes, k, is fixed and has above been assumed to be 64. The number of redundant bytes, however, depends on the band. Let $$a(x) = \sum_{l=0}^{63} a_l x^l$$

be an information string to be encoded.

Assume now a circuit that divides by $g(x)$ and find the result of the division. Circuits of this type are straightforward in implementation of RS codes. Now let $$b(x) = \sum_{l=0}^{11} b_l x^l$$

be the result of dividing $x^{12}a(x)$ by $g(x)$. The output of the encoder in polynomial notation then is, according to the band in which we want to encode $a(x)$:

For band 1: $b_6 + b_7x + \ldots + b_{11}x^5 + a_0x^6 + a_1x^7 + \ldots + a_{63}x^{69}$ For band 2: $b_4 + b_5x + \ldots + b_{11}x^7 + a_0x^8 + a_1x^9 + \ldots + a_{63}x^{71}$ For band 3: $b_2 + b_3x + \ldots + b_{11}x^9 + a_0 x^{10} + a_1x^{11} + \ldots + a_{63}x^{73}$ For band 4: $b_0 + b_1x + \ldots + b_{11}x^{11} + a_0x^{12} + a_1x^{13} + \ldots + a_{63}x^{75}$ If the channel is bursty, encoding can be completed by interleaving the eight codewords corresponding to each sector in the manner described at pp. 271-272 in *Error Control Coding: Fundamentals and Applications*, by Lin and Costello, published in 1983 by Prentice-Hall. This allows the code to correct several bursts of length up to 57 bits each.

Figure 2:
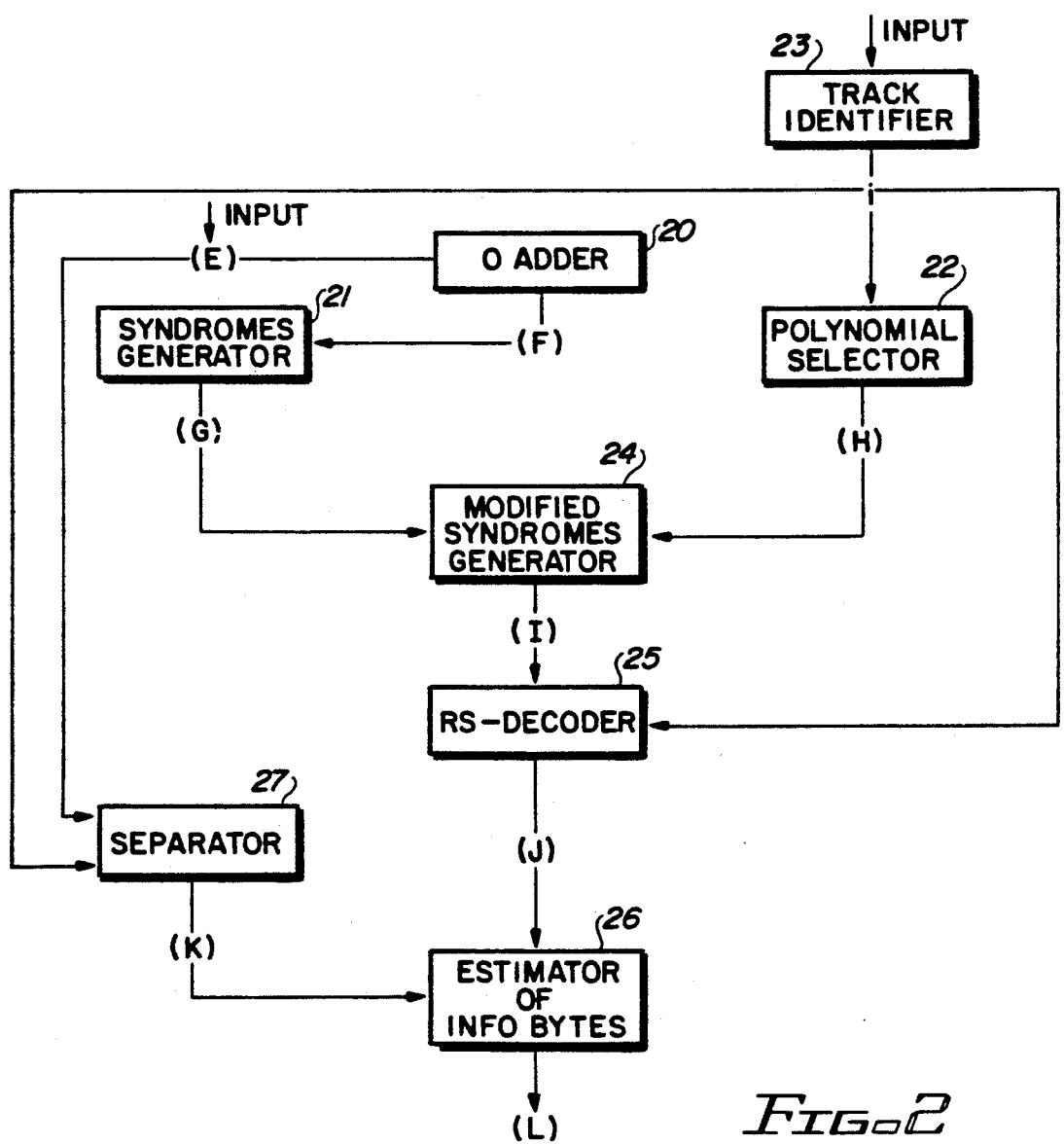
FIG. 2 is a schematic diagram showing the decoding process for implementing the invention.

B.1—Decoding Process—FIG. 2

If the code has been interleaved, the first step is to deinterleave.

The length of the received word depends upon the band being considered. In band i, $1 \leq i \leq m$, the received word has length $k+2(t+i-1)$. So, assume that band i is being accessed and let $$r_0, r_1, \ldots, r_{k+2(t+i-1)-1} \tag{E}$$

be the input for the decoding process. It is desired that the same decoding circuits be used as the regular $[k+2(t+m-1),k]$ code, so the first step in decoding using a 0 adder 20 adding 0's at the beginning of the received word in such a way that a vector of length $k+2(t+m-1)$ is obtained which in polynomial notation is expressed as $$r^{(i)}(x) = x^{2(m-i)} \sum_{l=0}^{k+2(t+i-1)-1} r_l x^l, \tag{F}$$

as in Section I. Polynomial (F) is transmitted to a syndromes generator 21, where the $2(t+m-1)$ syndromes are estimated. Specifically, $$S_j = r^{(i)}(\alpha^j) = \alpha^{2(m-1)j} \sum_{l=0}^{k+2(t+i-1)-1} r_l \alpha^{jl},$$

$$1 \leq j \leq 2(t+m-1),$$

which expressed as a syndrome polynomial is $$S(x) = S_1 + S_2 x + \ldots + S_{2(t+m-1)} x^{2(t+m-1)-1} \tag{G}$$

Now, the first $2(m-i)$ locations are considered as erasures. So, it is necessary to calculate the erasure locator polynomial $$\sigma_i(x) = (x+\alpha^0)(x+\alpha) \ldots (x+\alpha^{2(m-i)-1}). \tag{H}$$

Since it is known a priori what the erasures are, the polynomials $\sigma_i(x), 1 \leq i \leq m$ will meanwhile have been stored in a polynomial selector 22 that receives as input the band i from a track identifier 23 and produces an output the (H) of the $\sigma_i(x)$ (Convention: $\sigma_m(x) = 1$). The outputs (G) and (H) of the syndromes generator 21 and polynomial selector 22 are input to a modified syndromes generator 24 that produces an output the product $$S(x)\sigma_i(x). \tag{I}$$

The modified syndrome polynomial (I) is fed to a RS-decoder 25. RS-decoder 25 solves the fundamental equation $$\sigma(x)\sigma_i(x)S(x) = \omega(x)(\bmod x^{2(t+m-1)}),$$

where $\sigma(x)$, the error locator polynomial, is a polynomial of degrees $\leq t+i-1$ and $\omega(x)$, the error evaluator polynomial, has degrees $\leq t+2m-i-2$. Decoder 25 finds $\sigma(x)$ and $\omega(x)$ using variations of Euclid's algorithm. Circuits that implement this algorithm are well-known; for example, see *Practical Error Correction Design for Engineers*, by Glover and Dudley, Data Systems Thechnology, 1988 at pp. 163-167. The roots of $\sigma(x)$ give the locations of the errors. If an error location, say j, is known, the value of the error at that location, say $e_j$, is obtained by performing the operation $$e_j = \frac{\omega(\alpha^j)}{\sigma'(\alpha^j)\sigma_i(\alpha^j) + \sigma(\alpha^j)\sigma_i'(\alpha^j)}$$

The output of the RS-decoder is the string $$e_{2(t+i-1)}, e_{2(t+i-1)+1}, \ldots, e_{k+2(t+i-1)-1} \tag{J}$$

which includes only the errors corresponding to the information bytes. (note that there is no interest in errors in the redundant bytes).

Decoder output (J) is transmitted to an estimator of information bytes 26. Meanwhile, the original input (E) is sent to a separator 27 that produces as output the received bytes $$r_{2(t+i-1)}, r_{2(t+i-1)+1}, \ldots, r_{k+2(t+i-1)-1} \tag{K}$$

corresponding to the information locations. This output (K) is also transmitted to the estimator of information bytes 26, which simply performs the operation $$\hat{a}_p = r_j \oplus e_j, 2(t+i-1) \leq j \leq k+2(t+i-1)-1$$

So, the final output from the decoding process is the estimation $$\hat{a}_{2(t+i-1)}, \hat{a}_{2(t+i-1)+1}, \ldots, \hat{a}_{k+2(t+i-1)-1} \tag{L}$$

of the string of k information bytes.

B.2—Example Using Decoding Process

As earlier noted, if the code has been interleaved, the first step is to deinterleave. Also, as will be apparent from the foregoing description, the length of each encoded polynomial depends on the band being accessed. The first step in decoding is making the received polynomial have a length 76 by adding an appropriate number of 0's at the beginning. Assume that there is an error-erasure decoder, like 25, for a [76,64] RS code, and then proceed as follows:

For band 1: Let $r(x) = r_0 + r_1 x + \ldots + r_{69} x^{69}$ be the received polynomial. Apply the decoding algorithm with respect to $x^6 r(x)$ by adding 6 0's at the beginning, as a result of assuming that the first 6 bytes are erasures.

For band 2: Let $r(x) = r_0 + r_1 x + \ldots + r_{71} x^{71}$ be the received polynomial. Apply the decoding algorithm with respect to $x^4 r(x)$ by adding 4 0's at the beginning, as a result of assuming that the first 4 bytes are erasures.

For band 3: Let $r(x) = r_0 + r_1 + x \ldots + r_{73} x^{73}$ be thre received polynomial. Apply the decoding algorithm with respect to $r(x)$. No 0's will be added so that full error correcting capability will be available.

In all cases, the decoder produces as output the estimate $a(x) = a_0 = a_1 x + \ldots + a_{63} x^{63}$ of the information polynomial $a(x) = a_0 + a_1 x + \ldots + a_{63} x^{63}$. The [76,64] RS codes can correct s errors and e erasures whenever $2s + e \leq 12$. It will therefore be apparent that in band 1, with 6 erasures, the code can correct 3 bytes in error; in band 2, with 4 erasures, the code can correct 4 bytes in error; in band 3, with 2 erasures, it can correct 5 bytes in error; and in band 4, with no erasures, it can correct 6 bytes in error.

III. Summary

It will thus be seen that a novel method has been described for implementing error-correcting codes for, multiband disks wherein the code is adapted to the statistical error rate (i.e., statistical likelihood of error) of each band. The code is adapted to use less redundancy in the inner bands, where less noise occurs, thereby providing an overall gain in redundancy with respect to the traditional method. Applicants' method uses a RS encoder 10 and decoder 25 with the same circuits and the same degree of complexity as required for the traditional method. However, by truncating a certain number of bytes at the beginning of a codeword, redundancy is saved and adapted to the error-correcting necessities of the band. The decoder considers those truncated bytes as erasures.

Applicants' method allows significant savings in redundancy without compromising error-correcting capability. For example, in the four-band disk configuration assumed for purposes of the above description, if all the bands have the same number of sectors, on average, 9 redundant bytes are used per codeword (i.e., 36 redundant bytes per sector). By contrast, the traditional method would use 12 redundant bytes per codeword (i.e., 48 redundant bytes per sector). Applicants' method thus provides an increase in storage capacity for the disk of about 5%.

IV. Other Applications of the Invention

While the invention has been illustrated as applied to multiband disks wherein error rates are highest in the outermost band, it can also be applied to conventional magnetic disks, wherein error rates are highest in the innermost band. In the latter case, the number of redundant bytes will be progressively increased (rather than reduced) at each successive band toward the innermost band where magnetic transitions are more closely spaced.

Applicants' method can also be applied to read-write optical drives using multiband recording. One problem with optical storage is corrosion, with the result that the error statistics vary as a function of time. If these error statistics as a function of time are known, the error-correcting capability of the code can be enhanced at regular periods. Of course, storage capacity will be somewhat limited after doing so, but the lifetime of the storage disk will be considerably extended. If the effects of corrosion in time are not known, the behavior of the media can be monitored by counting the number of errors; and if the number of errors exceeds a certain threshold, the code can be modified to insert a fewer number of 0's in the inner bands. This modification to insert fewer 0's can be accomplished adaptively by automatic feedback from the error counter to the modified syndromes generator 24. Thus by dynamically sensing errors in the respective bands, the redundancy of the error-correcting code can be adaptively modified to assure appropriate error correcting capability.

We claim:

1. A method for implementing an error-correcting code for a disk having a plurality of concentric recording areas and, wherein statistical error rate varies according to radial location of each recording area, comprising the steps of:
   selecting a Reed-Solomon code having data bytes and a number of redundant bytes providing an error-correcting capability that protects against an anticipated worst case of errors for the concentric area having a preselected maximum acceptable statistical error rate; and
   using a single encoder, recording data on selectable ones of the concentric areas of the disk and concurrently progressively reducing the redundant bytes in said code, and thereby a related number of correctable errors, in the respective concentric areas of the disk according to a corresponding respective statistical error rate for such areas, for thereby progressively reducing the number of correctable errors as a need for error correction capability decreases.

2. The method of claim 1, wherein said areas are concentric bands and each of said bands is recorded at a clock frequency proportional to its inner diameter, and wherein during the recording step the number of redundant bytes is reduced progressively in each successive band toward an innermost one of the bands for thereby correspondingly reducing the number of correctable errors.

3. The method of claim 1, wherein during the recording step, each of said areas of the disk is recorded at a preselected constant frequency, and the number of redundant bytes is progressively reduced toward an outermost one of the concentric areas.

4. The method of claim 1, wherein each area is a data recording track.

5. A method for implementing an error-correcting code for a disk having a plurality of concentric recording areas, comprising the steps of:
   selecting a Reed-Solomon code having data bytes and a number of redundant bytes providing an error-correcting capability that protects against an anticipated worst case of errors for the concentric area having a preselected maximum acceptable error rate; and
   using a single encoder, recording data on selectable ones of the concentric areas of the disk and concurrently dynamically increasing toward said number of redundant bytes, and thereby a related number of correctable errors, in each successive adjacent concentric area for thereby progressively increasing error correction capability as a need therefor increases.

6. The method of claim 5, including the steps of:
   counting the number of errors encountered in he respective concentric areas; and
   when said number exceeds a preselected threshold, increasing the number of redundant bytes during the recording step, thereby to extend the useful life of the disk with somewhat reduced storage capacity.

7. The method of claim 5, wherein each concentric area is a band recorded at a clock frequency proportional to its inner diameter, and wherein during the recording step redundant bytes are increased toward said number progressively in each successive band toward an outermost one of said bands as need for correction capability increases.

8. The method of claim 5, wherein said concentric areas of the disk are tracks recorded at a preselected identical frequency, and wherein during the recording step the redundant bytes are increased toward said number periodically as the need for correction capability increases.

9. The method of claim 5, wherein the disks are write-once optical disks and need for increased correction capability is due to disk corrosion.

10. A method of implementing an error-correcting code for a disk having a plurality of concentric recording areas, comprising the steps of:

selecting a Reed-Solomon code having a fixed number of data bytes and a polynomial having a full length with a number of redundant bytes that provides a preselected degree of error correction capability for the data bytes in a particular one of said concentric areas having a preselected maximum acceptable statistical error rate;

encoding a binary input string using said polynomial for progressively reducing the number of redundant bytes in each concentric area to provide a respective degree of error correction capability corresponding to a respective statistical error rate for such concentric area; and during decoding, adding a number of 0's to each encoded string that will bring said encoded string to a length corresponding to the full length of the polynomial, said added number being considered as erasures, whereby error correction capability for the respective concentric areas decreases as the number of 0's increases.

11. The method of claim 10, wherein the areas are recorded in concentric bands.

12. The method of claim 10, wherein the areas are concentric recording tracks.

13. The method of claim 10, wherein a single recorder is used in the encoding step irrespective of the degree of error correction capability provided.

* * * * *